United States Patent
Yokoyama et al.

(10) Patent No.: US 6,526,561 B2
(45) Date of Patent: *Feb. 25, 2003

(54) DATABASE FOR DESIGNING INTEGRATED CIRCUIT DEVICE, AND METHOD FOR DESIGNING INTEGRATED CIRCUIT DEVICE

(75) Inventors: Toshiyuki Yokoyama, Kyoto (JP); Masanobu Mizuno, Osaka (JP); Makoto Fujiwara, Kyoto (JP); Miwaka Takahashi, Kyoto (JP); Michiaki Muraoka, Nara (JP)

(73) Assignee: Matsushita Electric Industrial Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/418,311

(22) Filed: Oct. 14, 1999

(65) Prior Publication Data

US 2003/0014729 A1 Jan. 16, 2003

(30) Foreign Application Priority Data

Oct. 16, 1998 (JP) ............................................. 10-295511

(51) Int. Cl.$^7$ ................................................. G06F 17/50
(52) U.S. Cl. ................................. 716/18; 706/50; 716/2; 716/6; 716/7; 716/19
(58) Field of Search .............................. 716/2, 6, 7, 18, 716/19; 706/50

(56) References Cited

U.S. PATENT DOCUMENTS

| | | | | |
|---|---|---|---|---|
| 5,726,902 A | | 3/1998 | Mahmood et al. | 716/6 |
| 5,757,655 A | | 5/1998 | Shih et al. | 716/2 |
| 5,828,579 A | | 10/1998 | Beausang | 716/2 |
| 5,836,014 A | * | 11/1998 | Faiman | 717/7 |
| 5,883,814 A | | 3/1999 | Luk et al. | 716/2 |
| 5,903,886 A | * | 5/1999 | Heimlich et al. | 706/50 |
| 5,912,819 A | * | 6/1999 | Kucukcakar et al. | 716/19 |
| 6,026,228 A | | 2/2000 | Imai | |

* cited by examiner

Primary Examiner—Matthew Smith
Assistant Examiner—Thuan Do
(74) Attorney, Agent, or Firm—McDermott, Will & Emery

(57) ABSTRACT

A database, in which data is stored in a flexibly usable state, is provided for use in the design of an integrated circuit device, and a method for designing an integrated circuit device using such a database is also provided. A design environment includes: a virtual core database (VCDB), which is hierarchical design data storage; and a virtual core database management system (VCDBMS) as a control system. The VCDB includes architecture information and a VC cluster. The VC cluster includes: a specification VC for storing therein data at a specification level; an architecture VC for storing therein data at an architectural level; an RTL-VC for storing therein data at a register transfer level; and a performance index used for evaluating the performance of the respective VCs. By providing these VCs for respective layers, new VCs can be generated, data within the VCs can be modified and instances can be generated at the respective levels. As a result, the data can be used flexibly and recycled as well.

3 Claims, 20 Drawing Sheets

Fig. 5

| | |
|---|---|
| hierarchical level | :specification or architecture or RT layer |
| design data (diagram) | : |
| verification data | :test vector |
| performance info. | :area, delay, (power dissipation) |
| higher- or lower-level (correlated) layer info. | :higher-level VC of an order higher than VC in question<br>lower-level VC of an order lower than VC in question |
| derivative info. | :other VCs that belong to the same layer and were consulted when VC in question was generated other VCs consulted |
| sharing info. | :information shared among VCs belonging to the same layer |
| contents of modifications | :addition or correction |
| interface | :parallel or serial or PCI bus, ⋯ |

Fig. 7

```
PRCESS P1;
  DCL Vin integer;
  DCL Vout integer;
START;
  TASK Vin i=0, Vout i=0;
  OUTPUT F1( );
  NEXTSTATE S1;
START S1;
  INPUT F2( );
  NEXTSTATE S2;
  ENDSTATE;
START S2;
     ⋮
ENDPROCESS P1;
```

Fig. 8

```
module HW1(A, B, S);
input A, B;
output S;
reg S;
always @(AorB) begin
  S<=A+B;
end
endmodule
```

Fig. 9

```
int SW1( ){
  ⋮
  switch (cond){
  case S1;
  ⋮
  return;
}
}
``` architecture layer

RT layer

Fig. 12

| RT layer | | meta | instance |
|---|---|---|---|
| | design data | module %module1(clk,reset,data1,data2,out);<br>input clk,reset;<br>input [3:0] data1,data2;<br>output out;<br>wire [3:0] data3;<br>%module2 counter_1(clk,reset,data1,data3);<br>%module3 counter_2(clk,reset,data2,out);<br>endmodule | module channel(clk,reset,data1,data2,out);<br>input clk,reset;<br>input [3:0] data1,data2;<br>output out;<br>wire [3:0] data3;<br>counter counter_1(clk,reset,data1,data3);<br>counter counter_2(clk,reset,data2,out);<br>endmodule |
| | verification data | module %module4;<br>reg clk,reset;<br>parameter [3:0] data1=4'b0000;<br>parameter [3:0] data2=4'b1111;<br>wire out;<br>%module1 chan_1(clk,reset,data1,data2,out);<br>:<br>endmodule | module test;<br>reg clk,reset;<br>parameter [3:0] data1=4'b0000;<br>parameter [3:0] data2=4'b1111;<br>wire out;<br>channel chan_1(clk,reset,data1,data2,out);<br>:<br>endmodule |

(21) specification layer
(22) architecture layer
(23) RT layer
(24) instance RT layer

Fig. 17(a)

| name | layer info. | higher- or lower-level layer info. | | derivative info. | | sharing info. | modification info. |
|---|---|---|---|---|---|---|---|
| | | higher | lower | original | derived | | |
| X | 21 | 0 | XA, XB | 0 | Z | 0 | 0 |

Fig. 17(b)

| name | layer info. | higher- or lower-level layer info. | | derivative info. | | sharing info. | modification info. |
|---|---|---|---|---|---|---|---|
| | | higher | lower | original | derived | | |
| Y | 21 | 0 | YC | 0 | Z | 0 | 0 |

Fig. 17(c)

| name | layer info. | higher- or lower-level layer info. | | derivative info. | | sharing info. | modification info. |
|---|---|---|---|---|---|---|---|
| | | higher | lower | original | derived | | |
| Z | 21 | 0 | ZG | X, Y | 0 | 0 | 0 |

Fig. 17(d)

| name | layer info. | higher- or lower-level layer info. | | derivative info. | | sharing info. | modification info. |
|---|---|---|---|---|---|---|---|
| | | higher | lower | original | derived | | |
| ZG | 22 | Z | XB, YC | $X(\alpha), Y(\gamma)$ | 0 | $X(\alpha)', Y(\gamma')$ | $\tau$ newly generated |

(21) specification layer
(22) architecture layer
(23) RT layer
(24) instance RT layer

| name | layer info. | higher- or lower-level layer info. | | derivative info. | | sharing info. | modification info. |
|---|---|---|---|---|---|---|---|
| | | higher | lower | original | derived | | |
| XA | 22 | X | XAA, XAB | 0 | 0 | 0 | 0 |

| name | layer info. | higher- or lower-level layer info. | | derivative info. | | sharing info. | modification info. |
|---|---|---|---|---|---|---|---|
| | | higher | lower | original | derived | | |
| XA | 22 | X' | XAA, XAB | 0 | 0 | 0 | $X \to X'$ |

| name | layer info. | higher- or lower-level layer info. | | derivative info. | | sharing info. | modification info. |
|---|---|---|---|---|---|---|---|
| | | higher | lower | original | derived | | |
| XB | 22 | X | XBA | 0 | ZG | 0 | 0 |

| name | layer info. | higher- or lower-level layer info. | | derivative info. | | sharing info. | modification info. |
|---|---|---|---|---|---|---|---|
| | | higher | lower | original | derived | | |
| XB' | 22 | X' | XBA | 0 | ZG | 0 | $XB(\alpha', \beta') \to XB'(\gamma', \beta')$ |

(21) specification layer

(22) architecture layer

(23) RT layer

(24) instance RT layer

Fig. 21(a)

| name | layer info. | higher- or lower-level layer info. | | derivative info. | | sharing info. | modification info. |
|---|---|---|---|---|---|---|---|
| | | higher | lower | original | derived | | |
| X | 21 | 0 | XA,XB | 0 | Z | 0 | 0 |

Fig. 21(b)

| name | layer info. | higher- or lower-level layer info. | | derivative info. | | sharing info. | modification info. |
|---|---|---|---|---|---|---|---|
| | | higher | lower | original | derived | | |
| X' | 21 | 0 | XA,XB | 0 | Z | 0 | $X \rightarrow X'$ |

Fig. 21(c)

| name | layer info. | higher- or lower-level layer info. | | derivative info. | | sharing info. | modification info. |
|---|---|---|---|---|---|---|---|
| | | higher | lower | original | derived | | |
| Z | 21 | 0 | ZG | X | 0 | $X(\alpha)$ | $\tau$ newly generated |

| name | layer info. | higher- or lower-level layer info. | | derivative info. | | sharing info. | modification info. |
|---|---|---|---|---|---|---|---|
| | | higher | lower | original | derived | | |
| Z' | 21 | 0 | ZG' | X' | 0 | $X(\delta)$ | $X \rightarrow X'$<br>$Z(\alpha, \tau) \rightarrow Z'(\delta, \tau)$ |

| name | layer info. | higher- or lower-level layer info. | | derivative info. | | sharing info. | modification info. |
|---|---|---|---|---|---|---|---|
| | | higher | lower | original | derived | | |
| Z | 21 | 0 | ZG | X' | 0 | 0 | $X \rightarrow X'$ |

DATABASE FOR DESIGNING INTEGRATED CIRCUIT DEVICE, AND METHOD FOR DESIGNING INTEGRATED CIRCUIT DEVICE

BACKGROUND OF THE INVENTION

The present invention generally relates to a database for use in the design of an integrated circuit device and to a design method using such a database. More particularly, the present invention relates to design technology to cope with system-on-chip implementation.

A semiconductor device for an electronic unit has been fabricated until just recently by forming individual types of LSI's such as memories and processors on respective semiconductor chips and then mounting and interconnecting these chips on a motherboard like a printed wiring board.

Over the past few years, however, a semiconductor device is increasingly required to reduce the overall size, power dissipation and fabrication cost thereof to further broaden the industrial applicability of an electronic unit including such a device. Among other things, a consumer electronic unit for use in digital information processing has to meet all of these requirements more often than any other electronic unit. Responsive to such a demand from the electronics industry, the prime target of semiconductor technology is going to shift from memories to system LSI's.

Specifically, a system LSI is a single-chip implementation including memories and various types of logic circuits on a single chip. To form a system-on-chip, not only the technology of forming devices like transistors with dissimilar structures on a common substrate, but also the design technology thereof should be greatly innovated.

Thus, according to a suggested technique of designing a system-on-chip, a database is prepared in advance to design an arbitrary block consisting of a great number of cells, each implementing a required function, e.g., a so-called "functional block". By using such a database, any desired system LSI can be allegedly designed as a combination of blocks. In such a case, a specific physical structure for performing an intended function has been defined in advance for each block. Thus, in the physical design of an overall semiconductor device, only the interconnections among these functional blocks and peripheral circuitry have to be newly designed. In this manner, the conventional method tries to increase the design efficiency considerably.

The conventional design procedure, however, is too simplified to make flexible use of the blocks. For example, it is impossible to selectively use just some components of a certain block. This is because the conventional design procedure only defines which blocks should be used and how and where these blocks should be placed and interconnected. In addition, these blocks are supposed to be customized at a lower level, i.e., logic synthesis or layout design level. Accordingly, various demands on a system LSI, like downsizing, might not be satisfactorily met by such an overly simple design procedure.

SUMMARY OF THE INVENTION

A general object of the present invention is constructing a novel design system that can substitute for the conventional block-based design method.

A more particular object of the present invention is providing a database, in which data about various components is stored as a collection of virtual cores in a flexibly usable state, for use in the design of an integrated circuit device.

Another specific object of the present invention is providing a method for designing an integrated circuit device using such a database.

A first exemplary database according to the present invention includes a plurality of VC clusters for storing therein data needed in designing an integrated circuit device. Each said VC cluster includes: a specification/arhitecture VC for constructing the integrated circuit device; and an RTL-VC for storing therein data at an RT level required for meeting a specification and an architecture represented by the data stored on the specification/architecture VC.

According to the first database, it is possible to provide a design environment, in which the data stored on respective VCs within a VC cluster can be used flexibly at the higher-order specification/architecture and RT levels, not at the lower-order levels for circuit design or layout.

In one embodiment of the present invention, the specifcation/architecture VC is preferably classified into: a specification VC for storing therein data at the specificaton level; and an architecture VC for storing therein data at the architectural level required for meeting the specification represented by the data stored on the specification VC.

In another embodiment of the present invention, the database preferably further includes a performance index including a plurality of parameters used for evaluating the performance of the integrated circuit device. The performance index is represented in the specification/architecture VC as a first range within a multi-dimensional space using the parameters as coordinates. The performance index is represented in the RTL-VC as a second range within a multidimensional space or a point using the parameters as coordinates. The second range is narrower than the first range.

A second exemplary database according to the present invention includes a plurality of VCs for storing therein data needed in designing an integrated circuit device. The database includes an instance manager for managing instances obtained by replacing respective variables of the data stored on the VCs with associated constants.

According to the second database, VC data can be managed smoothly.

A third exemplary database according to the present invention includes a specification VC for storing therein data at a specification level needed in designing an integrated circuit device. The specification VC stores: design data describing specifications required for constructing the integrated circuit device; verification data used for checking the specifications described by the design data; and performance data used for evaluating the performance of the integrated circuit device.

According to the third database, it is possible to confirm even at the specification level that the specification data stored on the VCs is not out of a performance range required for the system. Thus, design and verification will not be performed in vain at upcoming lower levels.

A fourth exemplary database according to the present invention includes an architecture VC for storing therein data at an architectural level needed in designing an integrated circuit device. The data stored on the architecture VC is classified into data about hardware-implementable architectures and data about software implementable architectures.

According to the fourth database, hardware/software cooperative design or verification at the architectural level is enabled. Accordingly, a database best suited to automated design is obtained.

A fifth exemplary database according to the present invention includes a VC cluster made up of a plurality of VCs for storing therein data needed in designing an integrated circuit device. The database includes a management table Indicating a common characteristic or function portion among the data stored on the respective VCs within the VC cluster.

According to the fifth database, search can be performed easily and quickly to know whether or not interface, clock, power supply or resource can be shared.

A first exemplary method according to the present invention is adapted to design an integrated circuit device using a database including a plurality of VCs for storing therein data needed in designing the integrated circuit device. The method includes the step of generating instances by replacing respective variables of the data stored on the VCs with associated constants.

According to the first method, instances can be generated adaptively to external information, thus improving utility and efficiency.

In one embodiment of the present invention, the instances are preferably generated by replacing a name of a module, which is one of the variables of the data stored on the VCs, with an associated constant.

A second exemplary method according to the present invention is adapted to design an integrated circuit device using a database including a specification VC for storing therein data at a specification level needed in designing the integrated circuit device. The method includes the steps of; generating instances by changing the data stored on the specification VC into specific one; and storing the instances generated on the database.

According to the second method, instances can be generated at the specification level adaptively to external information, thus improving utility and efficiency.

A third exemplary method according to the present invention is adapted to design an integrated circuit device using a database including: a specification VC for storing therein data at a specification level needed in designing the integrated circuit device; and an architecture VC for storing thereon data at an architectural level needed for meeting a specification represented by the data stored on the specification VC. The method includes the step of deleting an unnecessary portion of the data at the architectural level.

According to the third method, the quality of the integrated circuit device can be improved efficiently.

A fourth exemplary method according to the present invention is adapted to design an integrated circuit device using a database including a plurality of VCs for storing therein data needed in designing the integrated circuit device. The method includes the step of generating correlated information by extracting a portion sharable among at least some of the VCs from the data stored on the VCs.

According to the fourth method, the interface, clock, power supply or resource can be shared by utilizing the correlated information among the respective VCs during the design process.

A fifth exemplary method according to the present invention is adapted to design an integrated circuit device using a database including an architecture VC, on which data at an architectural level needed in designing the integrated circuit device is classified into data about hardware-implementable architectures and data about software-implementable architectures. The method includes the step of performing hardware-software cooperative design or verification.

According to the fifth method, an easily automatable design method is provided while using VCs.

A sixth exemplary method according to the present invention is adapted to design an integrated circuit device using a database including a VC cluster. The VC cluster includes: a specification/arhiteculture VF for storing therein data at specification and architectural levels needed for constructing the integrated circuit device; and an RTL-VC for storing therein data at an RT level required for meeting a specification and an architecture represented by the data stored on the specification/architecture VC. The method includes the step of generating a new VC by using the data stored on the VCs within the VC cluster.

According to the sixth method, the design data stored on respective VCs within the VC cluster is flexibly reusable.

BRIEF DESCRIPTION OF THE DRAWINGS

FIG. 5 illustrates the structure of each VC according to the present invention.

FIG. 7 illustrates exemplary design data described in a format called "SDL" according to the present invention.

FIG. 8 illustrates exemplary data generated in the hardware section according to the present invention.

FIG. 9 illustrates exemplary data generated in the software section according to the present invention.

FIG. 12 illustrates examples of meta and instance in the RT layer according to the present invention.

FIGS. 17(a) through 17(d) illustrate examples of specific data items stored on respective VCs in generating a new VC through derivative processing according to the present invention.

FIGS. 19(a) and 19(b) illustrate examples of specific data items stored on respective VCs during intra-VC-cluster modification processing according to the present invention.

FIGS. 21(a) through 21(e) illustrate examples of specific data items stored on respective specification VCs during inter-VC-cluster modification processing according to the present invention.

DESCRIPTION OF THE PREFERRED EMBODIMENTS (Definitions of VC, VCDS and VCDB)

First, virtual core and virtual core design system according to the present invention will be defined.

The "virtual core (VC)" according to the present invention is a concept definitely distinct from the "virtual component", which is often regarded as synonymous with the "intellectual property (IP)" or "functional block". Unlike the virtual component, the virtual core is defined to design a system as a single integral block. Also, the virtual core stands for a collection of data including reusable hardware and software. The "virtual core design system (VCDS)" according to the present invention refers to an overall system adapted to optimize the hardware and software indispensable for a desired system LSI by using the VC. The "virtual core database (VCDB)" means a database for use in the VC-based design.

(Schematic Construction of VCDS)

Figure 1:
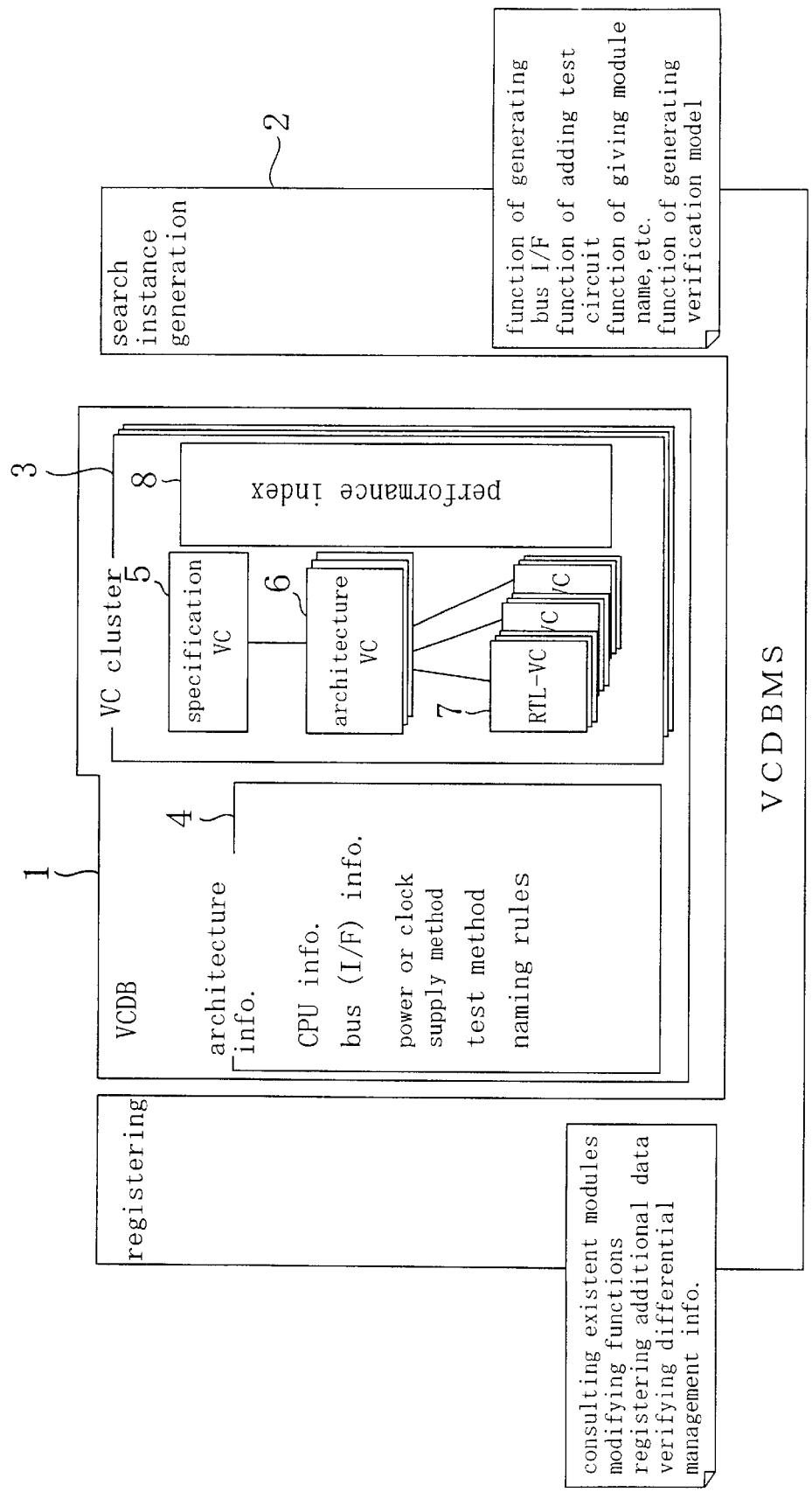
FIG. 1 illustrates a schematic construction of a virtual core design system (VCDS) used for designing a system LSI according to the present invention.

FIG. 1 illustrates a schematic construction of the VCDS used for designing a system LSI according to the present invention.

As shown in FIG. 1, the VCDS according to the present invention is made up of: a VCDB 1, which is implementable as hierarchical data storage for storing therein data needed in designing a system; and a virtual core database management system (VCDBMS) 2, which is a control system for optimizing the VCDB 1.

The VCDB 1 includes: a VC cluster 3, which is a collection of virtual cores; and architecture information 4, which is used to determine the VC architecture of the VC cluster 3. The VC cluster 3 includes: a specification VC 5, which is a virtual core for storing therein data described as specifications; architecture VCs 6, which are virtual cores for storing therein data described as architectures; register transfer-level (RTL) VCs 7, which are virtual cores for storing therein data described at the register transfer level; and a performance index 8 used for evaluating the performance of each VC.

In this specification, the "architecture" defines the allocation of software and hardware with respect to a single set of specifications. Generally speaking, various types of architecture are associated with a single set of specifications. Also, in this specification, the "register transfer" defines hardware-implementable architecture. In general, several different types of implementations are imaginable for a single sort of architecture, because the architecture is implementable with mutually different sets of parameters respected. That is to say, as will be detailed later, the VC cluster 3 usually has a hierarchical structure, in which each specification VC 5 is associated with a plurality of architecture VCs 6 and each of these architecture VCs 6 is further associated with a plurality of RTL-VCs 7. It should be noted, however, that both the "specification" and "architecture" could be regarded as representing functional concepts. Accordingly, it is sometimes difficult to distinguish these two concepts clearly. In such a case, the specification VC and architecture VC may be combined with each other as a specification/architecture VC for a database.

Examples of the performance index 8 include parameters such as area and speed. At the RT level, for example, a certain value can be derived rather accurately. Also, if a system LSI has ever been implemented at the RT level by means of hardware, then the results may also be incorporated into the performance index 8. The performance index 8 will be described in further detail later.

The architecture information 4 includes information indicating how the respective VCs should be used in practice. For example, when a task should be implemented by means of software, the architecture information 4 tells us which processor and bus (or interface) should be used to execute the task, how power and clock pulses should be supplied, which type of test should be carried out for logic synthesis and what types of constraints will be imposed in naming (i.e., what types of tools should be used to avoid duplications).

Figure 2:
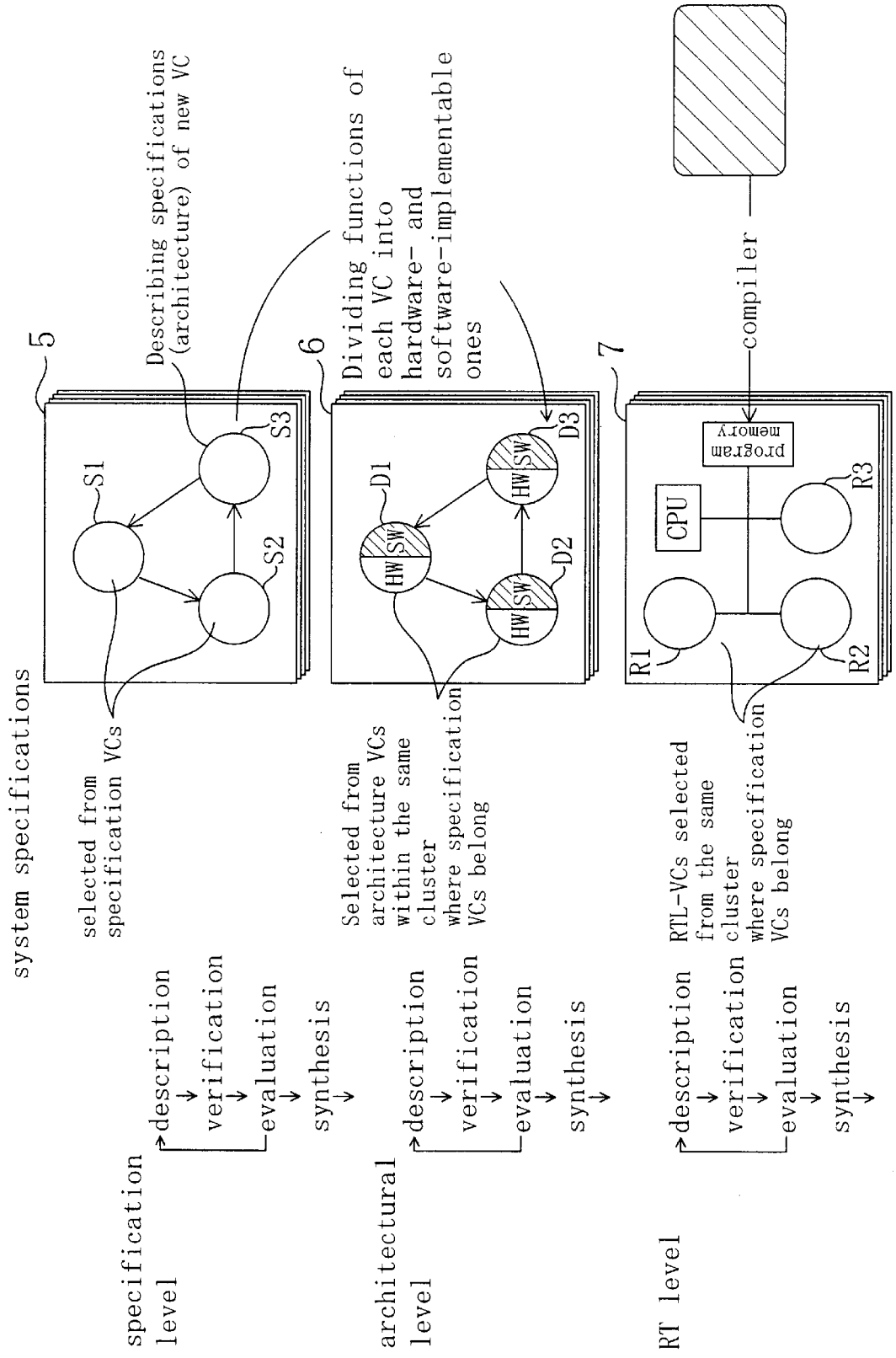
FIG. 2 illustrates a basic flow of tasks in the VCDS according to the present invention.

On the other hand, the VCDBMS 2 is used for registering new VCs with the VCDB 1, searching the VCDB 1 from the outside and generating instances. The registering process includes not only registering a brand new core, but also generating a new VC by consulting existent VCs and modifying the functions of the VCs, registering additional data items with the VCs, and storing differential management information therein. In this specification, the "search" means FIG. 2 illustrates a basic flow of the design procedure in the VCDS according to the present invention. As shown in FIG. 2, VCs are generated or modified following the processing steps of description, verification, evaluation and synthesis at each of the specification, architectural and RT levels. For example, at the specification level, specification VCs S1 and S2 may be chosen and a new VC S3 may be generated. In this case, the data flows in the direction as indicated by the arrows in FIG. 2, thereby describing, verifying and evaluating the data. Then, the evaluative results are fed back. At the architectural level, architecture Vcs D1, D2 and D3, corresponding to the specification VCs S1, S2 and S3, respectively, are generated. On this level, each of these VCs is divided into two sections, which are associated with hardware and software implementations, respectively, considering the intended functions thereof. At the RT level, not only RTL-VCs R1, R2 and R3, corresponding to the architecture VCs D1, D2 and D3, respectively, but also bus, CPU, memory and so on, interconnecting these VCs, are generated. That is to say, a more specific implementation is defined at the RT level.

Each of these tasks may be described as a state transition from a specification VC through external input/output sections. The specification VC is described in a language or figure representing state transition, logic and truth table.

By placing VCs at respective levels and managing these VCs collectively in this manner, a flexibly usable database, which is definitely different from a conventional functional block, can be provided.

(Construction of VC Cluster)

Figure 3:
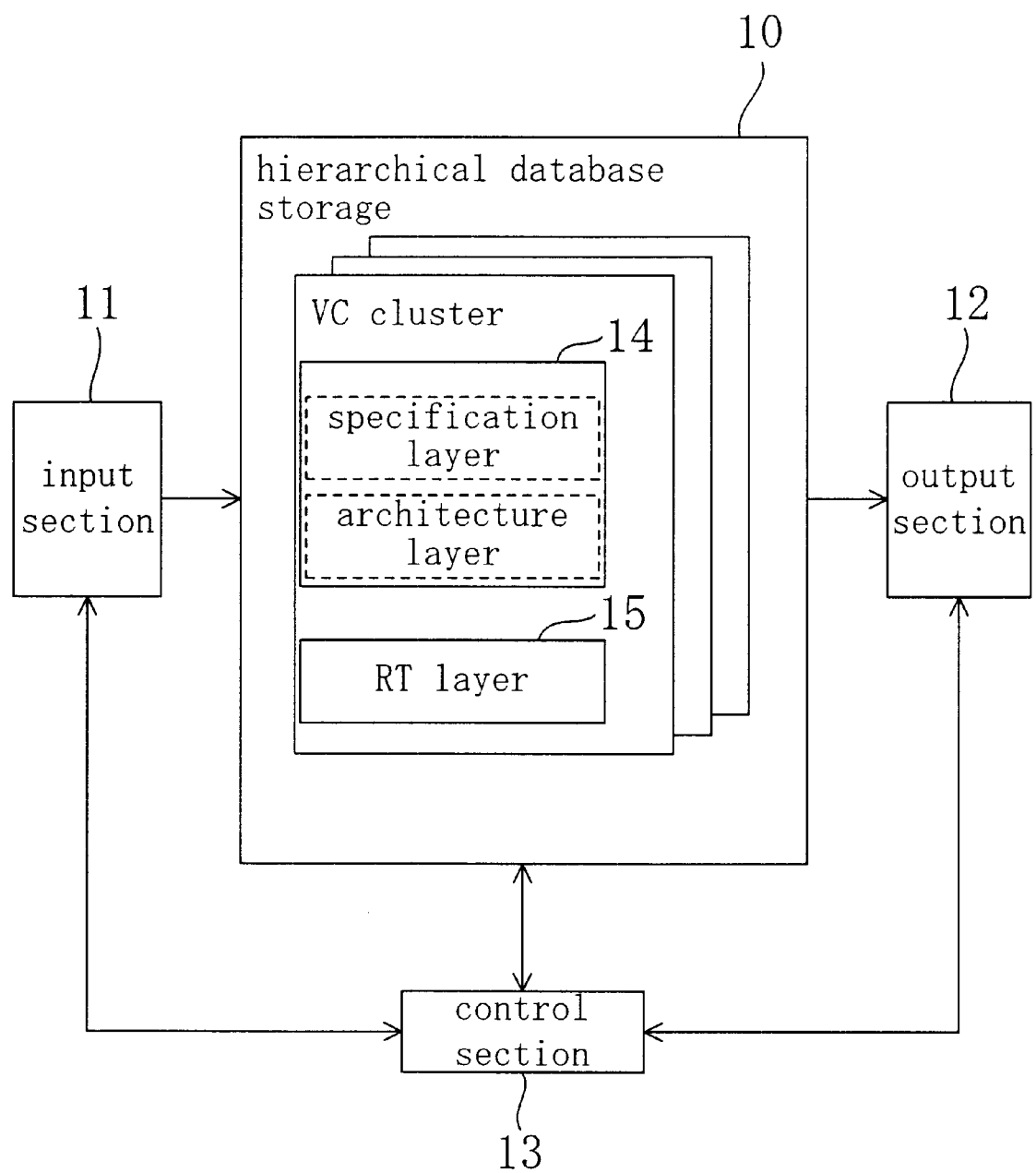
FIG. 3 is a block diagram illustrating the functional portions extracted from the system shown in FIG. 1.

FIG. 3 is a block diagram illustrating the functional portions extracted from the system shown in FIG. 1. As shown in FIG. 3, an input section 11 is provided for inputting information to the hierarchical database storage 10, on which the VC clusters 3 are stored. An output section 12 is further provided for receiving the information output from the hierarchical database storage 10. And a control section 13 controls the hierarchical database storage 10, input section 11 and output section 12. In each of these VC clusters 3, the functions represented by a specification layer for generating specification VCs, an architecture layer for generating architecture VCs and an RT layer 15 for generating RTL-VCs exist. Since the specification and architecture layers cannot always be distinguished clearly from each other, a combined specification/architecture layer 14 is illustrated in FIG. 3.

Figure 4:
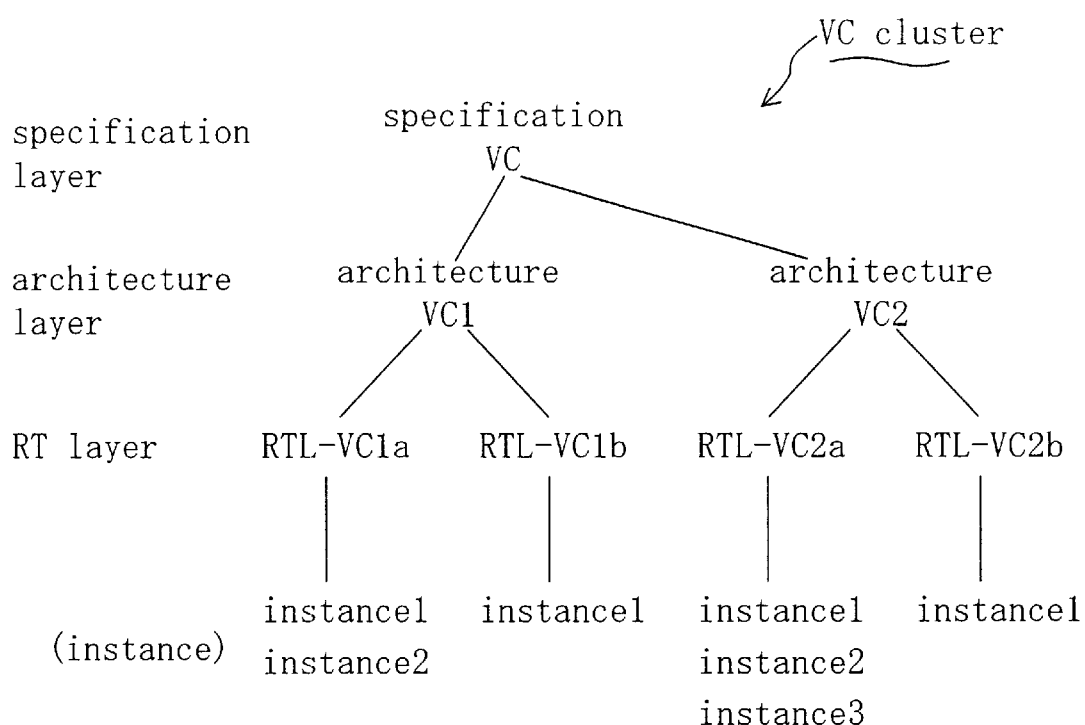
FIG. 4 illustrates in detail the functions of a VC cluster according to the present invention.

FIG. 4 illustrates the functions of a VC cluster in detail. As shown in FIG. 4, when a specification VC representing a certain function exists in the specification layer, a plurality of architecture VCs 1 and 2 usually exist in the next-highest-level architecture layer. And in the RT layer at the next level, a pair of RTL-VCs 1a and 1b exist to implement the architecture VC 1 and another pair of RTL-VCs 2a and 2b exist to implement the architecture VC 2. For example, since a single specification "multiplication" corresponds to various combinations of additions and shifts, a plurality of architectures usually exist correspondingly. Nevertheless, just one VC may exist at a lower level. In the example illustrated in FIG. 4, the single specification VC "multiplication" is associated with the architecture VC 1, which is an implementation respecting delay, and the architecture VC 2, which is an implementation respecting (occupied) area. Each of these layers has a function of generating and adding instance VCs. In the example illustrated in FIG. 4, each of the RTL-VCs 1a, 1b, 2a and 2b has a function of generating one or more instance VCs.

FIG. 5 illustrates the structure of each VC according to the present invention. Each VC belonging to the specification, architecture or RT layer includes: design data (diagram) to be described later; verification data such as test vectors; performance information in terms of area, delay (and power dissipation); higher- or lower-level (correlated) layer information, which is link information about VCs of respective orders higher or lower than the VC in question; derivative information about other VCs that belong to the same layer and were consulted when the VC in question was generated or other VCs consulted; information shared among VCs belonging to the same layer such as the architecture layer; contents of modifications if new items were added to the VC or if the VC was corrected; and interface information used for generating parallel, serial or PCI buses.

(Detailed Structures of Respective Layers)

Figure 6:
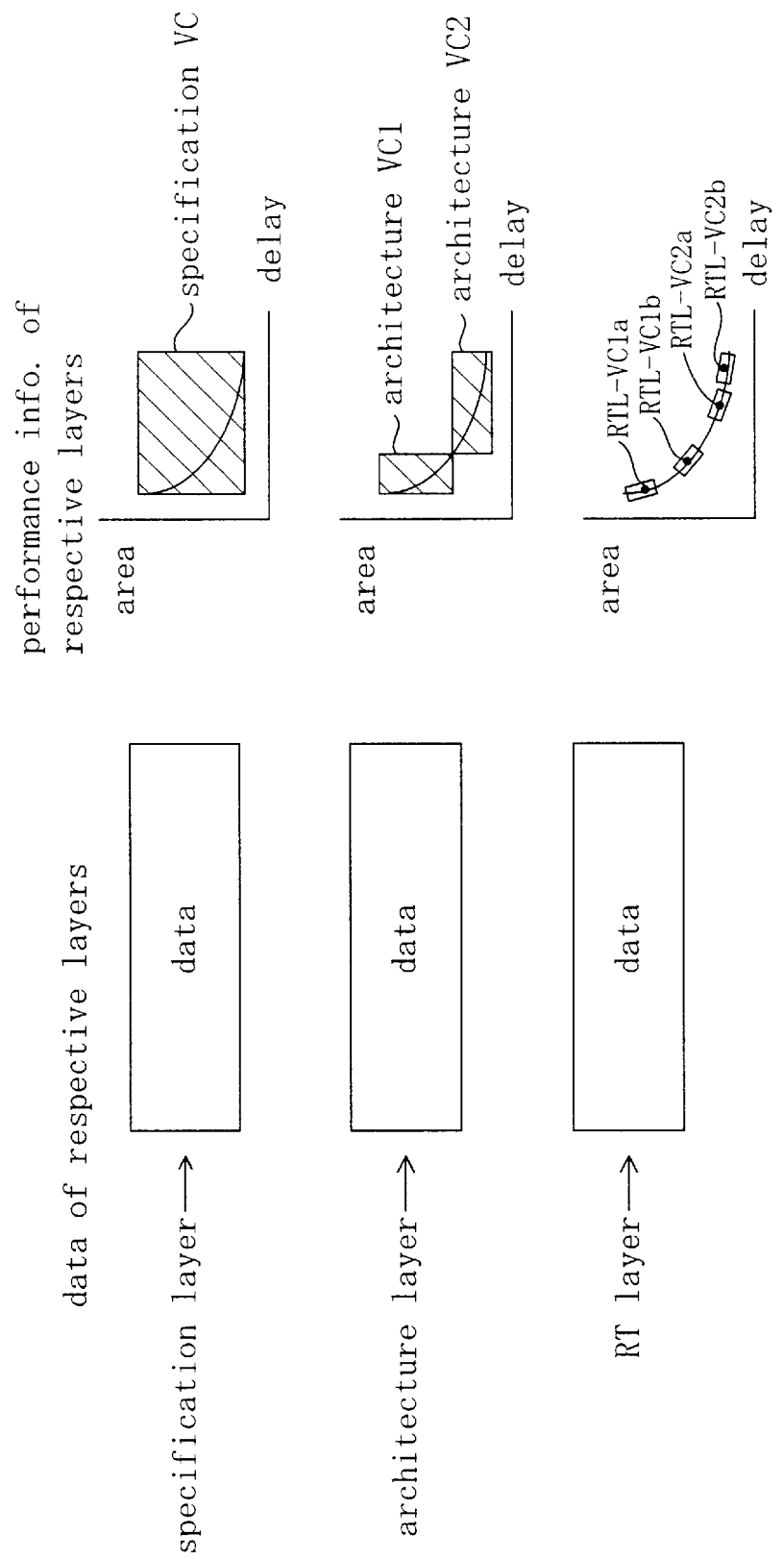
FIG. 6 illustrates relationships between data and performance information about VCs at respective levels according to the present invention.

FIG. 6 illustrates relationships between data and performance information about VCs at respective layers. On the right-hand side of FIG. 6, exemplary performance information about the respective layers is illustrated using the (occupied) areas and delays as parameters for evaluating the performance. On the left-hand side of FIG. 6, the design data and verification data about respective layers, which will be exemplified in FIGS. 7 through 9, exist, but the details thereof are omitted from FIG. 6 for the sake of simplicity. Hereinafter, the contents of respective layers will be described.

Specification Layer

The specification layer defines basic input/output relationships, which may be called "functions". Thus, the design data stored on the specification layer includes: the types of input/output signals; text based data; various standards such as protocols; performances, e.g., target performance to accomplish for compliance with a certain standard; and function specifications provided as documents. Specification descriptions (in the form of a language or figure) represented as a finite state machine (FSM), a control flow graph (CFG) or a data flow graph (DFG) are provided as specification verification models. Examples of specific formats include VHDL, SDL, LOTOS and C/C++. FIG. 7 illustrates exemplary design data described in a format called "SDL".

Architecture Layer

The architecture layer includes: architecture information; hardware section; and software section. The architecture information includes: name of the processor in question; name of the operating system (OS); and communication methods between hardware and software. For example, if processor, OS and simulation are combined, the name of the processor to be used may be Sparc, Pentium, etc., the name of the OS to be used may be UNIX, Windows, etc., and the hardware/software communication method adopted may be interprocess communication (IPC), programming language interface (PLI), etc. As the architecture information, not only appropriate combinations such as these, but also appropriate prerequisites are described. The CPUs may sometimes be omitted. In the hardware section, specifically implemented functions based on the information stored on the specification layer are stored as documents. More particularly, detailed operation modes, which are not defined by the specifications, are described in this section. FIG. 8 illustrates exemplary data stored on the hardware section. The data is described in a hardware description language such as Verilog HDL or VHDL. The contents of the software section are described in a source code such as C/C++. FIG. 9 illustrates exemplary data stored on the software section.

Figure 10:
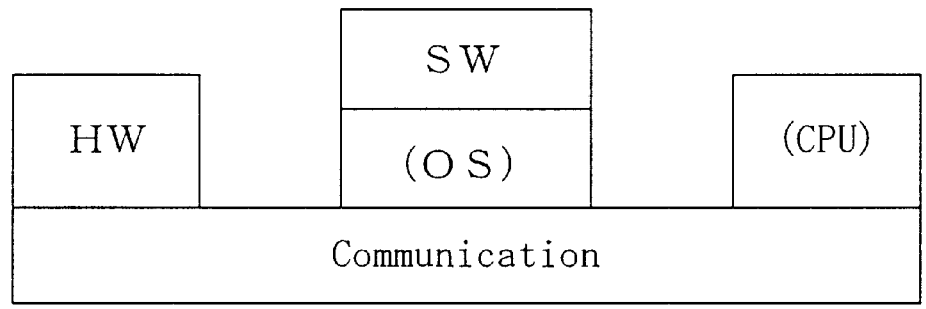
FIG. 10 illustrates an exemplary environment used for verifying the data stored on the architecture layer according to the present invention.

FIG. 10 illustrates an exemplary environment used for verifying the data stored on the architecture layer. The environment includes: the hardware (HW) section; the software (SW) section; a CPU if any; and a communication means inter-connecting these sections. As the case may be, an OS may exist between the communication means and the software section. That is to say, in this state, the bus interconnection has not been fixed yet.

Figure 11:
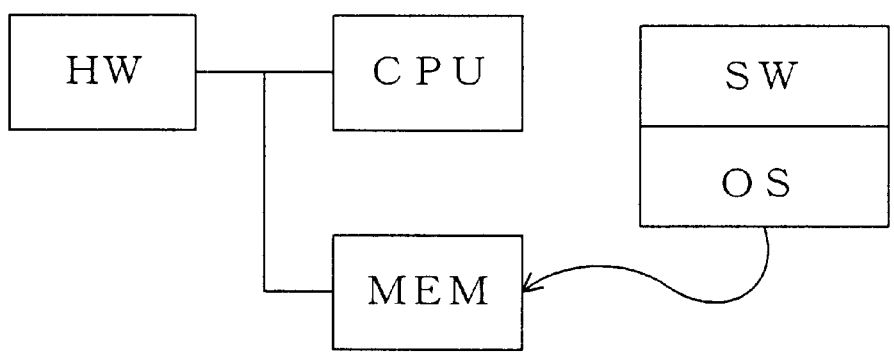
FIG. 11 illustrates an exemplary environment used for verifying the data stored on the RT layer according to the present invention.

RT Layer Like the architecture layer, the RT layer also includes: architecture information; a hardware section; and a software section. However, as shown in FIG. 11, a bus interconnecting the hardware (HW) section, CPU, memory (MEM), software (SW) section and OS together has already been defined in the RT layer. That is to say, the communication method has also been specified to such a level as indicating particular paths. Thus, by using the information stored on the RT layer, hardware implementation, or logic synthesis, is ensured. Each of the hardware and software sections includes a meta layer and an instance layer. In the meta layer, variables are described as respective parameters. On the other hand, the instance layer is obtained by replacing the variables in the meta layer with associated constants. FIG. 12 illustrates examples of meta and instance in the RT layer.

The architecture information stored on the RT layer includes the following information.

Firstly, cooperative verification models to be used in the architecture and RT layers are stored as processor (CPU) information. These models are associated with respective processors.

Secondly, information about a bus signal such as its type, width and so on and the bus protocol (timing) are stored as bus (I/F) information. Information needed in interconnecting the processor to respective hardware components is contained in this information.

Thirdly, a test method and required functions and specifications (dedicated terminals and circuits added) are stored as information about a test system. For example, when a full scan test is carried out, information about the scan-in Sin, scan-out Sout, scan clock signal Sclk and tracking error signal TE is required. On the other hand, if JTAG, which is one of boundary scan test methods, is adopted, then information about control terminals and TAP controllers is needed. Also, if an isolation test for directly testing respective cores externally should be carried out, then information about test mode terminals and selectors is needed. Examples of naming rules include: a constraint imposed on each EDA tool for processing an instance VC generated such as "the name of a module should be no longer than 16 alphanumeric lowercases"; and a constraint imposed not to generate different instance VCs with the same name such as "A981005 N should be added to the top of every module name".

Performance Information about Respective Layers

Suppose the specification VC shown in FIG. 4 exists in the specification layer. In such a case, the performance of the specification VC may be represented using area and delay as parameters like the hatched range on the upper-right graph in FIG. 6. The specification VC is associated with the architecture VC 1, which is an implementation respecting delay, and the architecture VC 2, which is an implementation respecting area, as shown in FIG. 4. As represented by the middle graph shown in FIG. 6, the range of the architecture VC 1 is a hatched region with smaller delay, while the range of the architecture VC 2 is a hatched region with smaller area. Also, as shown in FIG. 4, the architecture VC 1 is associated with the RTL-VCs 1a and 1b, while the architecture VC 2 is associated with the RTL-VCs 2a and 2b. As represented by the lower-right graph in FIG. 6, the area and delay of each of these RTL-VCs is defined as a point on the curve.

The performance information includes a large number of parameters. Thus, the performance information about each layer is actually represented as a multi-dimensional coordinate system, not the planar coordinate system shown in FIG. 6. Accordingly, in fact, the performance information about the RT layer is represented as a range or a point within a multi-dimensional space, while the performance information about the specification or architecture layer is represented as a range within a multi-dimensional space.

(Detailed Design Method Using VCDB)

Next, the contents of the control performed by the control section 13 shown in FIG. 3 will be described.

Generating Instance VCs

First, an instance is generated from an associated meta in the RT layer. FIG. 12 illustrates part of specific meta and instance data extracted. In the meta data, the underlined portions are variables, while the other portions are constants. Some of the constants were once variables, but have already been replaced with the constants. The meta data includes design data and verification data (test vectors), in which the modules names are variables. As shown in FIG. 12, tasks are described using the module names (such as "% module1") as variables. In generating an instance, variables like module or pin names are changed into constants so as to meet the output conditions such as "design rules (including specification tools and databases) should be complied with" and "the same module or pin names as those of other VCs should not be defined". For example, as shown in the instance column in FIG. 12, the variable "% module1" is replaced with a constant "channel".

Changing Verification Data

Correspondingly, the verification data such as the module names are also changed. For example, as shown in the verification data columns in FIG. 12, "% module1" is replaced with a constant "channel".

Generating Performance Information

Next, the control section 13 shown in FIG. 3 generates the performance information. First, in the RT layer, the performance information about the RTL-VC (meta layer) shown in the lower-right graph in FIG. 6 is generated. In the RT layer, each instance shares the same performance information with an associated meta. Next, the performance information bout the architecture VC shown in the middle graph in FIG. 6 is generated based on the performance information about the TL-VC. Then, the performance information about the specification VC shown in the upper-right graph in FIG. 6 is generated based on the performance information about the architecture VC. It should be noted that the performance information also contains information about power dissipation. That is to say, in using the database of this system, the performance information shown in FIG. 6 is sequentially consulted downward. In constructing a database on the other hand, the performance information shown in FIG. 6 should be sequentially generated upward.

Data Flow During Design Process

Figure 13:
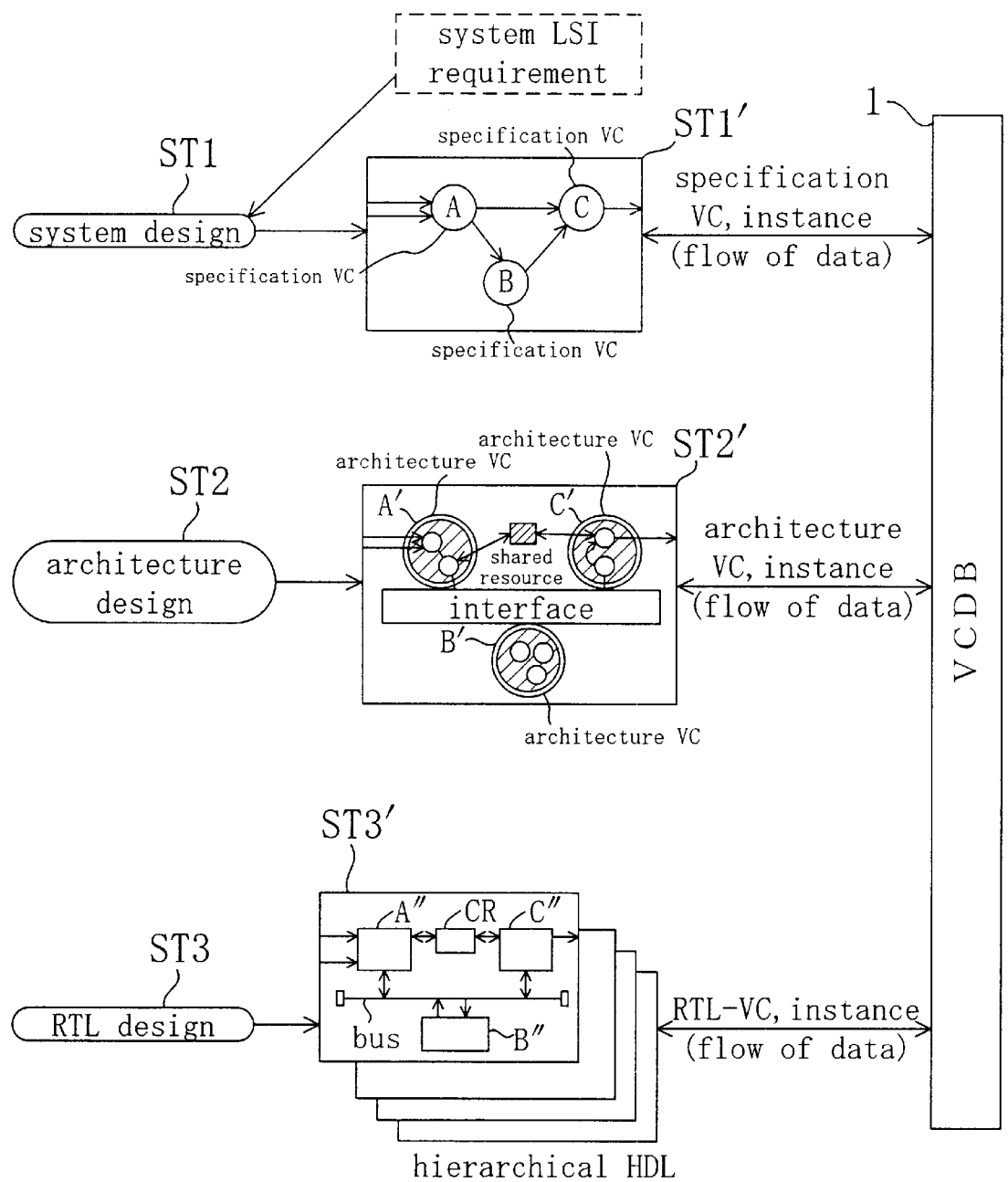
FIG. 13 is a modified flowchart illustrating the flow of design data during a design process using the VCDBMS according to the present invention.
Figure 14:
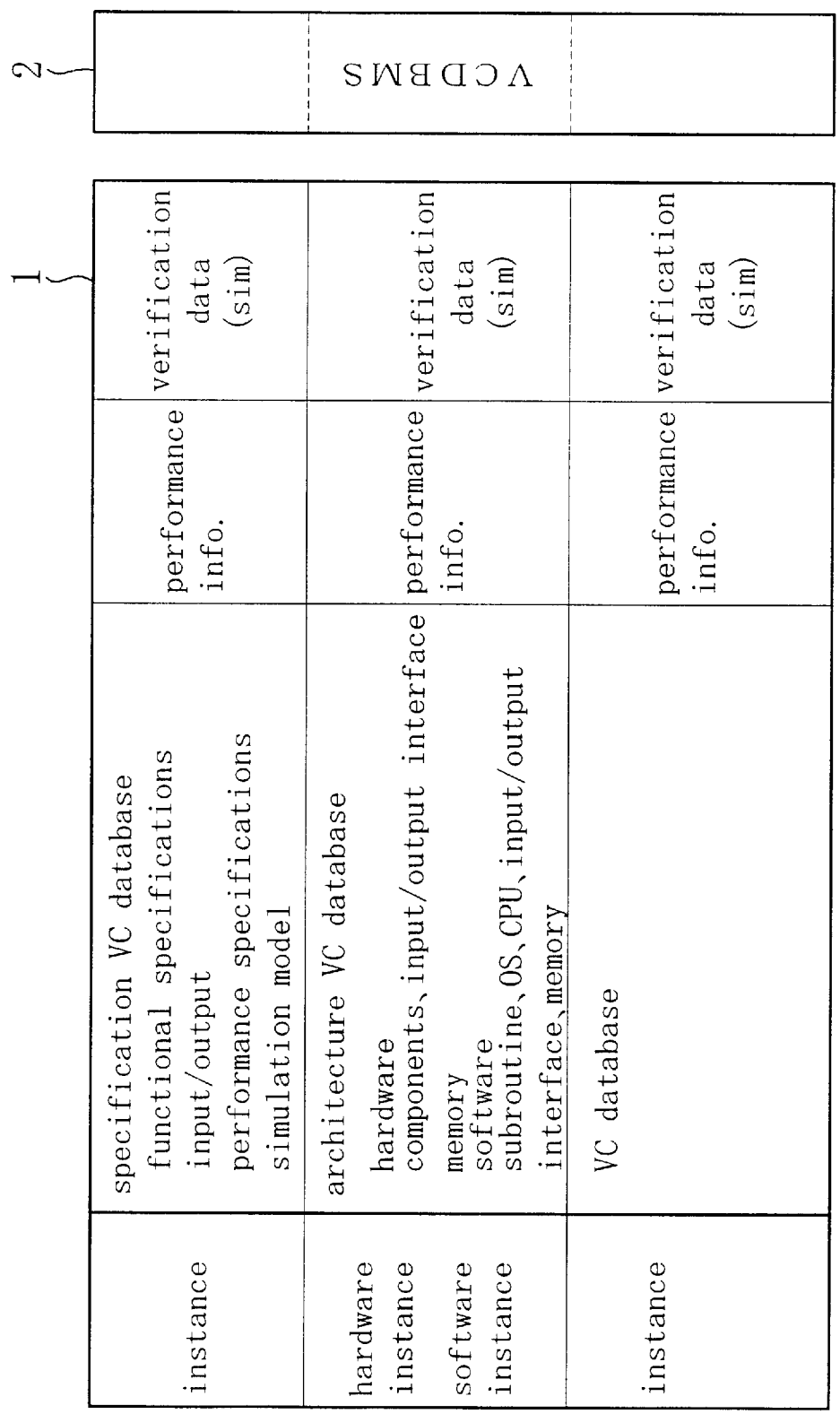
FIG. 14 illustrates an exemplary data structure of the VCDB according to the present invention.

FIG. 13 is a modified flowchart illustrating the flow of design data during a design process using the VCDB 1 according to the present invention. In FIG. 13, the design process steps at respective levels are identified by ST1 through ST3, and the contents of exemplary process steps are identified by ST1' through ST3'. FIG. 14 illustrates an exemplary data structure of the VCDB 1.

First, when system LSI requirements as indicated by the broken line in FIG. 13 are provided, a system is designed in such a manner as to meet the system LSI requirements in Step ST1. Specifically, the architecture of the system is divided and the respective divided functions are allocated to associated specification VCs. For example, as in the exemplary step ST1' shown in FIG. 13, a specification VC (A) meeting the system LSI requirements is selected from the VCDB 1 and then respective specification VCs (B) and (C) adapted to the architecture of the overall system are also selected from the VCDB 1. In the step ST1'(and the steps ST2' and ST3' described later), the arrows indicate the flow of data among the VCs selected. Also, when instance VCs are demanded from the VCDBMS shown in FIG. 1, the instance VCs are generated by replacing the parameters of the specification VCs with associated constants. Then, the instance VCs generated are registered in the instance section of the VCDB 1 (see FIG. 14). By generating the instance VCs and registering these VCs with the VCDB 1 in this manner, these instance VCs are reusable without causing any confusion.

These process steps may be either performed manually by a designer or automated. For example, the vCs can be named so as not to cause any duplication if the naming rule is defined in advance.

Next, in Step ST2, architecture is designed based on the architecture VC requirements that have been output as a result of the system design performed in step ST1. That is to say, since required specification VCs are known, it is now clear which types of architecture VCs can meet the functions of the specification VCs needed. Thus, architecture VCs are requested for the VCDB 1 to select required architecture VCs therefrom. As described above, one specification VC is usually associated with a plurality of architecture VCs. In Step ST2', an architecture VC A' including a plurality of components (or resources) is selected for one specification VC (A). In this step, sharable resources are shared and portions associated with unnecessary functions are deleted based on the intended function information. At this stage, interface data, which is interconnection information among the respective architecture VCs (A'), (B') and (C'), is also chosen, although the data does not define specific interconnection paths yet. In the processing step ST2', instance VCs are also generated and registered in the architectural-level instance section of the VCDB 1. Finally, compatibility is verified. That is to say, it is checked whether the respective architecture VCs can function without causing any incompatibility.

By deleting unnecessary functions in this manner, tasks associated with unwanted functions can be omitted, thus improving the quality of the integrated circuit efficiently.

Examples of information about unnecessary components include information about components other than a single component shared.

Next, in Step ST3, RTL design is carried out. Specifically, RTL-VCs (A"), (B") and (C") required for implementing the architecture VCs generated in Step ST2 are selected.

Specific Access Method

Figure 15:
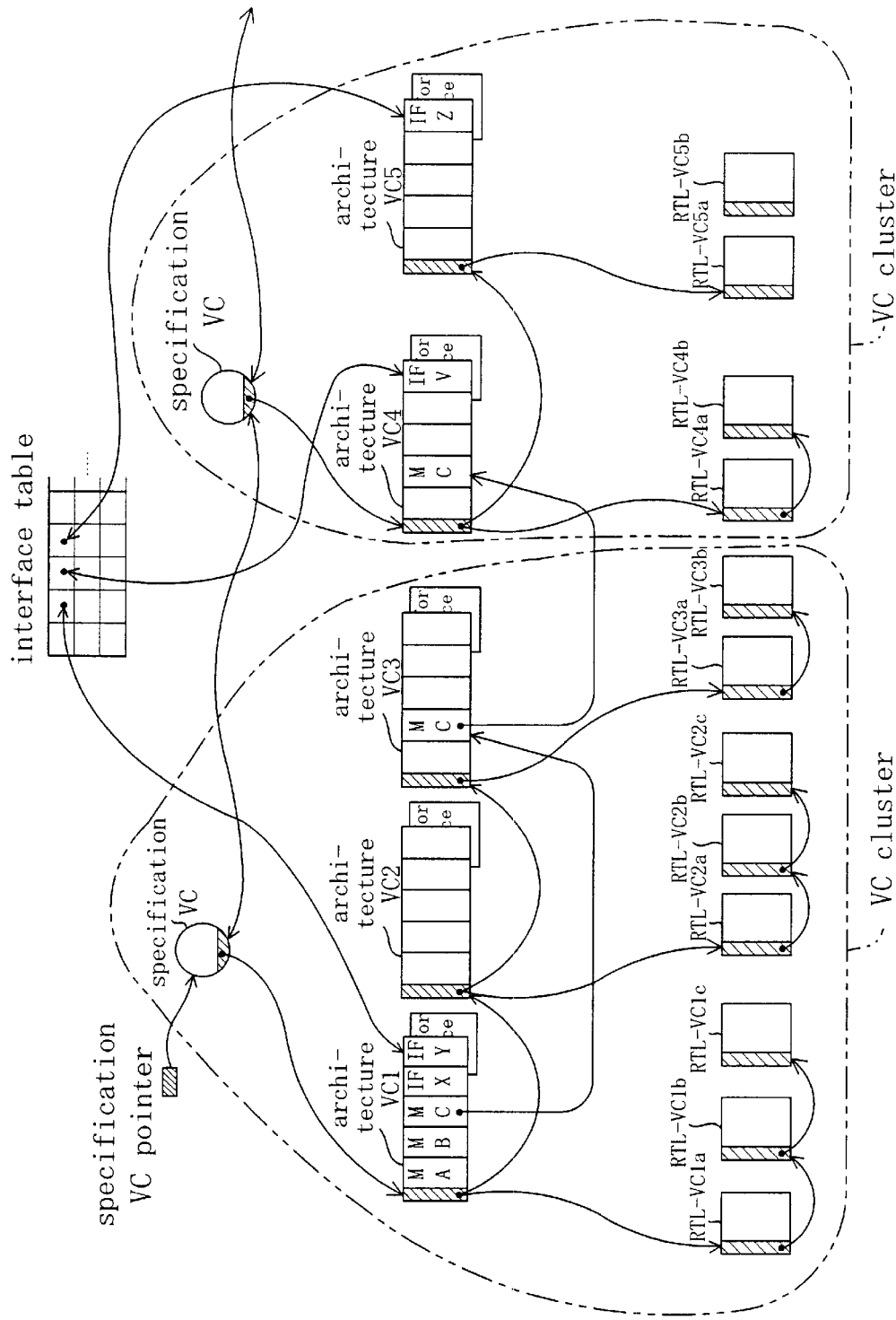
FIG. 15 illustrates an exemplary relationship between data structure and accessibility of the VCDB according to the present invention.

FIG. 15 illustrates an exemplary relationship between data structure and accessibility of the VCDB. Suppose five architecture VCs 1 through 5 have been generated for two specification VCs. Other architecture VCs have also been generated for other specification VCs, but are omitted from FIG. 15 for the sake of simplicity. Also, several RTL-VCs have been generated for each of these architecture VCs. In FIG. 15, the hatched portion of each VC is a pointer. That is to say, in the example shown in FIG. 15, a VC cluster structure is constructed using pointers.

For example, the architecture VC 1 includes information about hardware-implementable functional components "M(achine)-A", "M-B" and "M-C", information about input and output interface components "I/F(X)" and "I/F(Y)" and performance information. More specifically, a specification "multiplication" may correspond to "M-A", which is a component about an adder, and also correspond to "M-B", which is a component about a shifter. The same statement is applicable to the other architecture VCs 2 through 5.

According to the access method shown in FIG. 15, the following characteristic processing is performed.

Firstly, unnecessary functions are deleted based on the specification function information. For example, if the component "M-A" is unnecessary in the architecture VC, then the component is deleted during the generation of instance VCs. That is to say, instance VCs are generated without using this component. The deletion may also be performed either manually or automatically using a tool.

Secondly, based on the interface and interconnection information, interface components "I/F(Y)", "I/F(V)" and "I/F(Z)" are extracted from the architecture VCs 1, 4 and 5 to make an interface table. This table indicates that the respective interface components "I/F(Y)", "I/F(V)" and "I/F(Z)" can be interconnected together under a predetermined interface model (or specification). For example, if VCs that can be connected to the architecture VC 1 are searched for on this interface table, then it is immediately known that the architecture VCs 4 and 5 are connectable to the architecture VC 1. That is to say, by making this interface table beforehand, it is possible to see easily and quickly if a certain architecture VC is connectable to other architecture VC(s).

Also, if a table of information about the architecture is drawn up, then such a table is usable for checking the compatibility or searching for a sharable resource. For example, a clock table may be made by extracting respective components belonging to the common clocking system from the architecture VCs or a power table may be made by extracting respective components belonging to the common power supply system from the architecture VCs.

Thirdly, sharable resources are listed and interconnected via pointers. In the illustrated example, "M-C" of the architecture VC 1 is interconnected to "M-C" of the architecture VC 3 via a bidirectional pointer, and "M-C" of the architecture VC 3 is interconnected to "M-C" of the architecture VC 4 via another bidirectional pointer.

The information about sharable resources may be prepared as a table instead of interconnecting them via pointers.

Also, in generating the RTL-vCs, the sharable resources may also be interconnected together via pointers and the compatibility may also be checked by making interface, clock and power tables. Generally speaking though, if the sharable resources have been interconnected together or tables have been made at the architectural level, then the information defined may almost always be usable as it is at the RT level. Thus, it would be unnecessary to newly define such information at the RT level.

Derivative Processing

Next, exemplary derivative processing will be described.

Figure 16A:
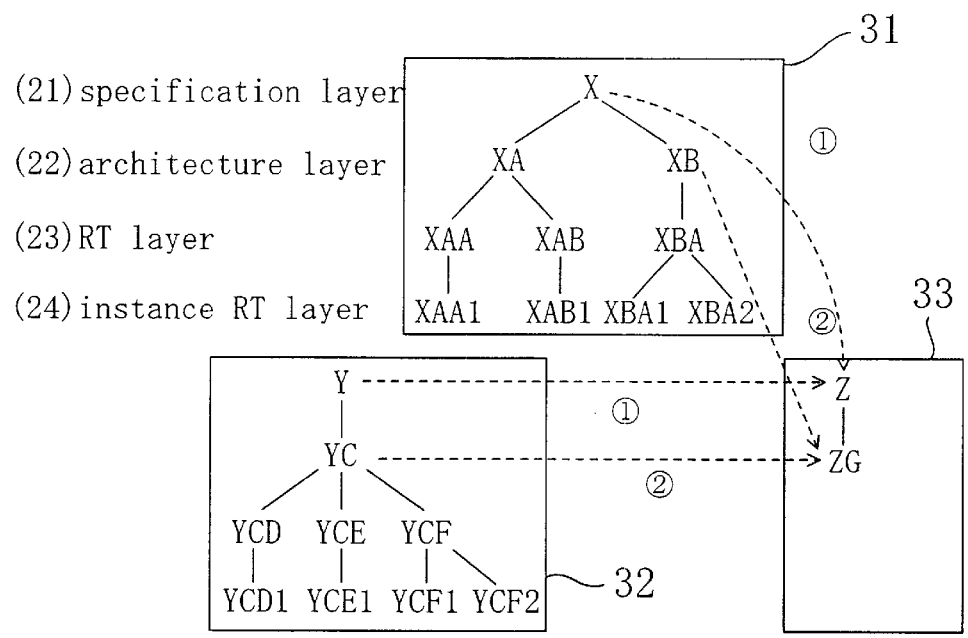
FIGS. 16(a) through 16(c) illustrate the procedure of derivative processing and how the data in respective VCs change in generating a new VC according to the present invention.
Figure 16B:
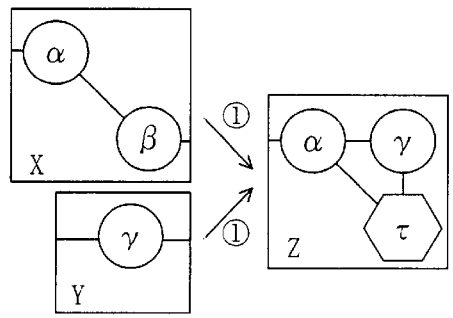
Figure 16C:
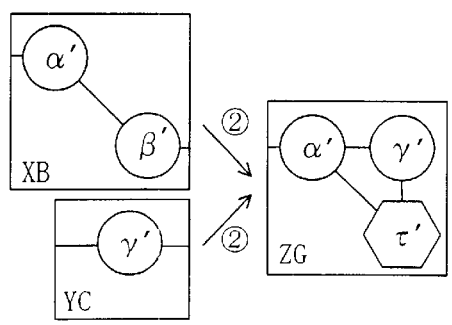

FIGS. 16(*a*) through 16(*c*) illustrate the procedure of derivative processing and how the data in respective VCs change in generating a new VC. As shown in FIG. 16(*a*), the specification, architecture, RT and instance RT layers are herein identified by the reference numerals 21, 22, 23 and 24, respectively. Also, suppose two VC clusters 31 and 32 exist. In the VC cluster 31, a specification VC X exists in the specification layer 21, architecture VCs XA and XB in the architecture layer 22, RTL-VCs XAA, XAB and XBA in the RT layer 23 and instance VCs XAA1, XAB1, XBAL and XBA2 in the instance RT layer 24. In the VC cluster 32, a specification VC Y exists in the specification layer 21, an architecture VC YC in the architecture layer 22, RTL-VCs YCD, YCE and YCF in the RT layer 23 and instance VCs YCD1, YCE1, YCF1 and YCF2 in the instance RT layer 24.

In FIG. 16(*a*), the procedure of generating a new specification VC Z based on the existent specification VCs X and Y is identified by ①, while the procedure of generating a new architecture VC ZG based on the existent architecture VCs XB and YC is identified by ②.

In generating the new specification VC Z based on X and Y, $\alpha$ and $\beta$, which are data of X, and $\gamma$, which is data of Y, are referred to, $\alpha$ and $\gamma$, which are data of Z, are used as they are and data $\tau$ is generated by modifying the contents of the data $\beta$. As a result, the contents of the data Z are $\alpha$, $\gamma$ and $\tau$.

In the same way, in generating the new architecture VC ZG based on XB and YC, $\alpha'$ and $\beta'$, which are data of XB, and $\gamma'$, which is data of YC, are referred to, $\Delta'$ and $\gamma'$, which are data of ZG, are used as they are and data $\tau'$ is generated by modifying the contents of the data $\beta'$. As a result, the contents of the data ZG are $\alpha'$, $\gamma'$ and $\tau'$.

As a result of these procedures, a new VC cluster 33 including the specification VC Z and the architecture VC ZG is generated. RTL-VCs are also generated in this VC cluster 33. However, the detailed procedure thereof will be omitted herein, because the same statement is applicable thereto.

FIGS. 17(*a*) through 17(*d*) illustrate examples of specific data items stored on respective VCs. For example, in the specification VC X, described are its name "X", the layer number "21", higher- or lower-level layer information (indicating there are no higher-level VCs but are lower-level VCs XA and XB in the architecture layer at the next level) and no derivative, sharing or modification information. Similar information items are described in the specification VC Y. In the newly generated specification VC Z, described are derivative information indicating "Z is derived from X and Y", sharing information "Z shares data α with X and data γ with Y" and modification information "data τ has been newly generated". Similar derivative, sharing and modification information is described in the architecture VC ZG.

Modification Processing (within VC Cluster)

Next, exemplary intra-VC-cluster modification processing will be described.

Figure 18A:
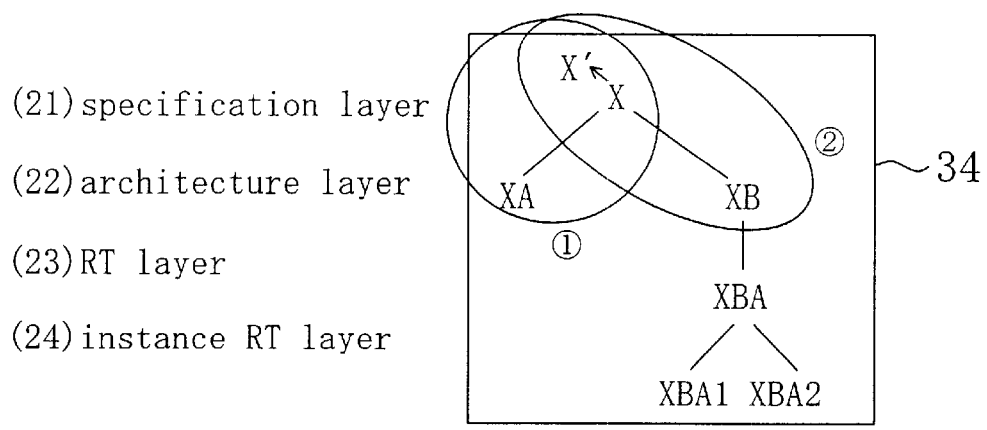
FIGS. 18(a) through 18(e) illustrate the procedure of intra-VC-cluster modification processing and how the data in respective VCs change according to the present invention.

FIGS. 18(a) through 18(e) illustrate the procedure of modification processing and how the data change within the VC. As shown in FIG. 18(a), the specification, architecture, RT and instance RT layers are also identified by the reference numerals 21, 22, 23 and 24, respectively. In the VC cluster 34, a specification VC X, an architecture VC XB, an RTL-VC XBA and instance VCs XBA1 and XBA2 exist in the specification, architecture, RT and instance RT layers 21, 22, 23 and 24, respectively.

In FIG. 18(a), the procedure of modifying X into X' without affecting the lower-level architecture VC XA is identified by ①, while the procedure of modifying X into X' while affecting the lower-level architecture VC XB is identified by ②.

The modification may be performed in the following manner. First, VCs XA and XB, which are located in the lower-level layer for X, are extracted. Next, it is checked whether or not the modification of X into X' affects the lower-level VCs XA and XB. The effects on higher-level VCs need not be checked.

Figure 18B:
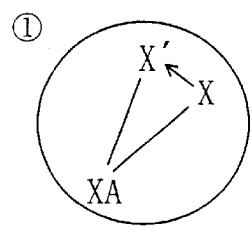

If the lower-level VC XA is not affected, then X is modified into X', i.e., the higher-level VC for XA is changed from X into X' as shown in FIG. 18(b).

Figure 18C:
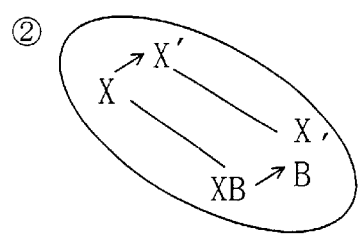
Figure 18D:
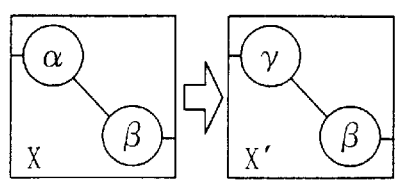
Figure 18E:
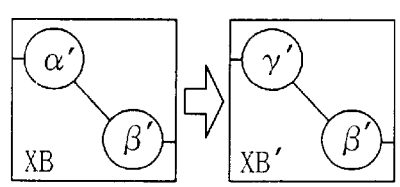

On the other hand, if the lower-level VC XB is affected, then X is modified into X', XB is also modified into XB' and X' is specified as the higher-level VC for XB' as shown in FIG. 18(c). In this case, a new VC X', the contents of which are data γ and β, is generated by consulting the data α and β of X as shown in FIG. 18(d). Also, a new VC XB', the contents of which are data γ' and β, is generated by consulting the data α' and β' of XB as shown in FIG. 18(e).

FIG. 19(a) illustrates examples of specific data items described in the architecture VC XA when the modification of X into X' does not affect the lower-level VC XA. FIG. 19(b) illustrates examples of specific data items described in the architecture VC XB' when the modification of X into X' does affect the lower-level VC XB.

Modification Processing (between VC Clusters)

Next, exemplary inter-VC-cluster modification processing will be described.

Figure 20:
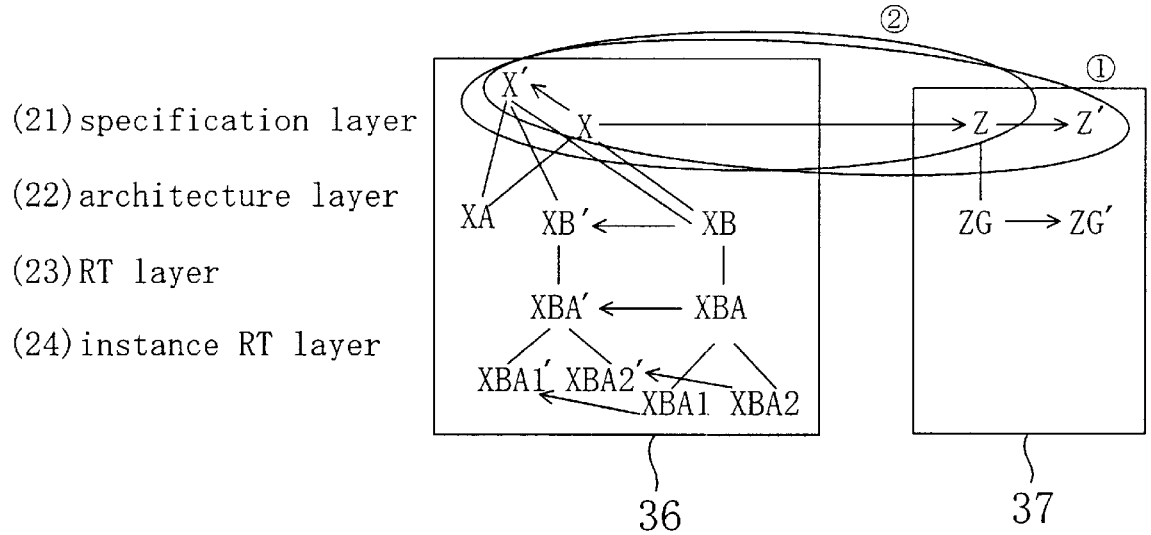
FIG. 20 illustrates the procedure of inter-VC-cluster modification processing according to the present invention.
Figure 22A:
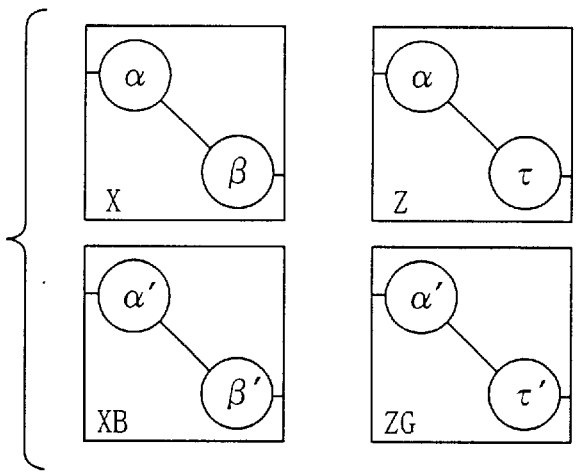
FIGS. 22(a) through 22(c) illustrate how the data changes in respective VCs during inter-VC-cluster modification processing according to the present invention.
Figure 22B:
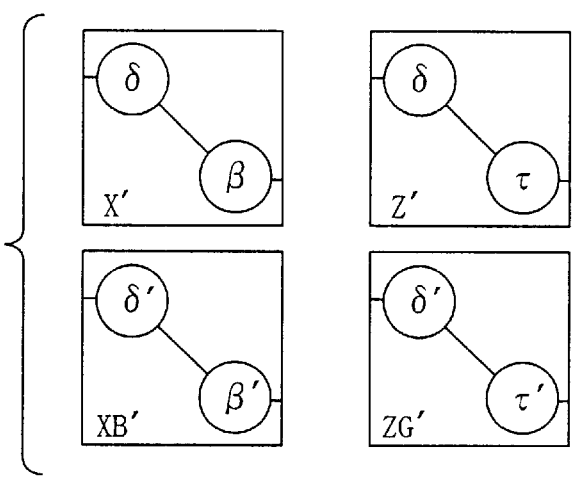
Figure 22C:
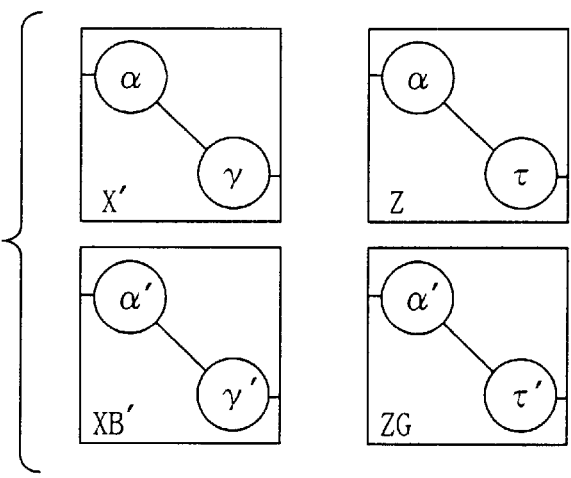

FIG. 20 illustrates inter-VC-cluster modification processing. FIGS. 21(a) through 21(e) illustrate examples of specific data in respective specification VCs in modification processing. FIGS. 22(a) through 22(c) illustrate how the data changes in respective VCs during modification processing.

As shown in FIG. 20, the specification, architecture, RT and instance RT layers are also identified by the reference numerals 21, 22, 23 and 24, respectively. In the illustrated example, a VC cluster 36 and another VC cluster 37, which has been derived from the VC cluster 36, are provided. In the VC cluster 36, a specification VC X, an architecture VC XB, an RTL-VC XBA and instance VCs XBA1 and XBA2 exist in the specification, architecture, RT and instance RT layers 21, 22, 23 and 24, respectively. On the other hand, in the VC cluster 37, a specification VC Z and an architecture VC ZG exist in the specification and architecture layers, respectively. In FIG. 20, a procedure when the modification of X into X' affects the specification VC Z in the derivative VC cluster 37 is identified by ①, while a procedure when the modification of X into X' does not affect the specification VC Z is identified by ②.

The modification may be performed in the following manner. First, the specification VC Z, the original parameter of which is indicated as "X" by the derivative information, is extracted from the specification vCs stored on the VCDB. Next, it is checked whether or not the modification of X into X' affects Z.

If the derived specification VC Z is affected, then the original specification VC information X is modified into X' and the higher-level VC for XA and XB is changed into X' in the VC cluster 36 as indicated by ① in FIG. 20. Also, in the VC cluster 37, Z is modified into Z' and the origin of Z' is specified as X'. In this case, the data of respective VCs are also consulted, but the description thereof will be omitted herein, because the same old statement is applicable to this case.

On the other hand, if the derived specification VC Z is not affected, then X is modified into X' and the original VC of Z is changed from X into X' as indicated by ② in FIG. 20.

For example, suppose the data of X are α and β, the data of Z are α' and τ, the data of XB are α' and β' and the data of ZG are α' and τ' before the modification as shown in FIG. 22(a). Then, the information within the respective specification VCs is as shown in FIGS. 21(a) through 21(c). In this embodiment, difference in modification processing depending on whether or not a specification VC has been modified is being described. Thus, the information about the architecture VCs will not be described, because the same statement as that applied to the intra-VC-cluster modification processing is also applicable.

Suppose the data of X' are now δ and β and the data of Z' are now δ and τ as shown in FIG. 22(b) as a result of the modification of X into X' where the derived specification VC Z is affected. And the architecture VC XB is changed into XB', of which the data are now δ'and τ'. In such a case, in the new specification VC Z' shown in FIG. 21(d), the lower-level layer information indicates ZG', the sharing information is X'(δ) and modification information indicates that X has been modified into X' and that Z(α, τ) has been modified into Z' (δ, τ).

On the other hand, if the derived specification VC Z is not affected, the data of X' are now α and γ but the data of Z are still α and τ as shown in FIG. 22(c) as a result of the modification of X into X'. In such a case, in the new specification VC Z shown in FIG. 21(e), the sharing information is zero and the modification information indicates that X has been modified into X'.

The data within these VCs and the control procedure of the VCDBMS may be stored on various storage media such as semiconductor memories or magnetic recording media.

What is claimed is:

1. A database comprising a plurality of VC clusters for storing therein data needed in designing an integrated circuit device, each said VC cluster including:
- a specification/architecture virtual core (VC) for storing therein data at specification and architectural levels needed for constructing the integrated circuit device;
- an RTL-VC for storing therein data at a register transfer level (RTL) required for meeting a specification and an architecture represented by the data stored in the specification/architecture VC, and
- a performance index including a plurality of parameters used for evaluating the performance of the integrated circuit device,
- wherein the specification and architecture level is a higher level than the register transfer level,
- wherein the performance index is represented in the specification/architecture VC as a first range within a multi-dimensional space using the parameters as coordinates, and
- wherein the performance index is represented in the RTL-VC as a second range within a multi-dimensional space or a point using the parameters as coordinates, the second range being narrower than the first range.

2. The database of claim 1, wherein the specification/architecture VC is classified into:
- a specification VC for storing therein data at the specification level; and
- an architecture VC for storing therein data at the architectural level required for meeting the specification represented by the data stored in the specification VC.

3. A method for designing an integrated circuit device using a database including a VC cluster, the VC cluster including: a specification/architecture virtual core (VC) for storing therein data at specificaton and architectural levels needed for constructing the integrated circuit device; an RTL-VC for storing therein data at a register transfer level (RTL) required for meeting a specification and an architecture represented by the data stored in the specification/architecture VC, and a performance index including a plurality of parameters used for evaluating the performance of the integrated circuit device,
- wherein the method comprises the step of generating a new VC by using the data stored in the VCs within the VC cluster,
- wherein the performance index is represented in the specification/arhitecture VC as a first range within a multi-dimensional space using the parameters as coordinates, and
- wherein the performance index is represented in the RTL-VC as a second range within a multidimensional space or a point using the parameters as coordinates, the second range being narrower than the first range.

* * * * *